United States Patent [19]

Birrittella

[11] Patent Number: 4,570,238

[45] Date of Patent: Feb. 11, 1986

[54] SELECTABLE WRITE CURRENT SOURCE FOR BIPOLAR RAMS

[75] Inventor: Mark S. Birrittella, Phoenix, Ariz.

[73] Assignee: Motorola, Inc., Schaumburg, Ill.

[21] Appl. No.: 748,368

[22] Filed: Jun. 24, 1985

[51] Int. Cl.$^4$ .............................................. G11C 13/00
[52] U.S. Cl. ..................................... 365/189; 365/230
[58] Field of Search ................ 365/182, 189, 230, 154

[56] References Cited

U.S. PATENT DOCUMENTS 4,399,519  8/1983  Masuda et al. ........................ 365/189

*Primary Examiner*—Terrell W. Fears
*Attorney, Agent, or Firm*—William E. Koch

[57] ABSTRACT

A memory circuit is disclosed having a plurality of memory cells coupled between a plurality of word lines and a plurality of bit lines such that each cell is uniquely coupled between a pair of word lines and a pair of bit lines. A sensing circuit is coupled to each pair of bit lines for determining the state of a selected cell. A column decode circuit is coupled to each pair of bit lines for selecting that pair of bit lines. A read current source is coupled between the bit lines and a voltage source for sinking a read current through the bit lines. A logic selectable write current source is coupled between the bit lines and the voltage source for sinking a write current when writing the memory cells for charging and discharging diffusion capacitance within the selected memory cell. Current flows through the logic selectable write current source only during the write mode.

20 Claims, 1 Drawing Figure

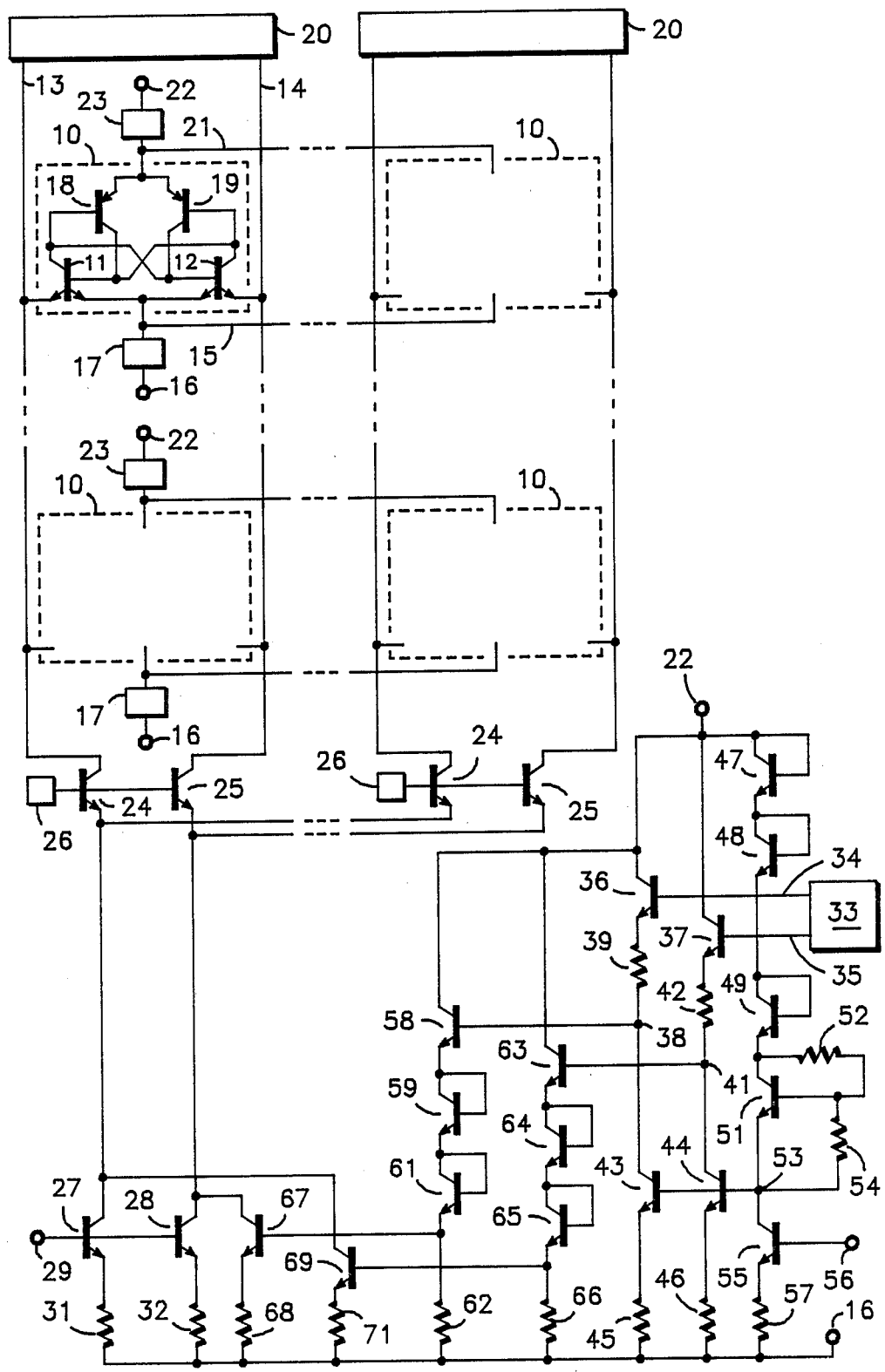

SELECTABLE WRITE CURRENT SOURCE FOR BIPOLAR RAMS

BACKGROUND OF THE INVENTION

1. Field of the Invention

This invention relates generally to bipolar random access memory (RAM) circuits and, more particularly, to a selectable current source for writing individual cells of the RAM.

2. Background Art

Memory cells are circuits wherein information may be stored in a low current stand-by mode and may be written or read in a higher current mode. A predetermined number of cells are located in a row between each of a plurality of upper and lower word lines and another predetermined number of cells are located in a column between a plurality of bit lines. In other words, each cell is uniquely coupled between a combination of word lines and bit lines.

There are many types of memory cells known in the art. Typically, two multi-emitter NPN transistors have their bases coupled to the collector of the other transistor. One emitter of each transistor is coupled to a lower word line and a second emitter of each transistor is coupled to a first and a second bit line, respectively. The bit lines may alternatively be referred to as column select lines. Two PNP load transistors have their emitters connected to an upper word line. The base and collector of each PNP transistor is connected to the collector and base, respectively, of each of the NPN transistors.

A row of cells is selected when increased voltage is supplied to the upper word line. A particular cell in that row is read by a sense amplifier coupled to the bit lines. A first read current through one bit line flows directly to the sense amplifier. A second read current through the other bit line flows through one side of the memory cell to the upper word line. When a cell is written, the first read current is directed through the cell and the second read current is directed to the sense amplifier.

However, the PNP transistors in each memory cell have a relatively large diffusion capacitance that must be charged by the first read current. This turns on the lateral PNP transistor's collector current which discharges the previously on PNP transistor's diffusion capacitance. To minimize this charge storage, the bit line currents could be reduced, but this would cause slower read access times. The read current must be approximately 0.5 microamps to give a fast access time. Therefore, conventional circuitry increases the current by the addition of a write current only during the write mode for charging and discharging this charge storage and aiding in writing the cell quickly. This write current would flow to the bit line only during the write mode (about 10 to 25 nanoseconds in duration). Previously known circuitry include a first and a second current source for providing an additional write current to one or both of the bit lines. The first and second current sources are "on" continuously, merely steering the write current from a load to the appropriate bit lines. The first and second write currents are steered by a column decode circuit. The column decode circuit includes a transistor having a collector coupled to the bit line leading to the memory cell and sense amplifier, and an emitter coupled to the first or second current source. The base-emitter capacitance of each of these transistors must be discharged before the write current will flow. This capacitance is equal to the summation of the base-emitter capacitance of each transistor in each bit line. The value of this capacitance increases as the size of the array increases.

Therefore, a memory cell array is needed having a circuit that provides a selectable write current that is substantially greater in amplitude than the read current and only flows during the write mode.

SUMMARY OF THE INVENTION

Accordingly, it is an object of the present invention to provide an improved memory circuit.

Another object of the present invention is to provide an improved memory circuit having a selectable write current source.

Yet another object of the present invention is to provide an improved memory circuit requiring substantially less current in the write mode.

Still another object of the present invention is to provide an improved memory circuit requiring less time in which to write a selected cell.

In carrying out the above and other objects of the invention in one form, there is provided an improved memory circuit having a plurality of memory cells coupled between a plurality of word lines and a plurality of bit lines such that each cell is uniquely coupled between a pair of word lines and a pair of bit lines. A sensing circuit is coupled to each pair of bit lines for determining the state of a selected cell. A column decode circuit is coupled to each pair of bit lines for selecting the desired pair of bit lines. A current source is coupled between the bit lines and a voltage source for setting the current level in the bit lines. A logic selectable write current source is coupled between the bit lines and the voltage source for sinking additional current when writing the memory cells for charging and discharging diffusion capacitance within the selected memory cell.

The above and other objects, features, and advantages of the present invention will be better understood from the following detailed description taken in conjunction with the accompanying drawing.

BRIEF DESCRIPTION OF THE DRAWING

The single figure is a schematic of the preferred embodiment of the invention.

DETAILED DESCRIPTION OF THE INVENTION

Referring to the single figure, a plurality of memory cells 10 are arranged in a matrix represented by rows and columns. Each cell 10 includes multiemitter transistors 11 and 12 each having a first emitter connected to bit lines 13 and 14, respectively, and a second emitter connected to lower word line 15. Lower word line 15 is coupled to voltage terminal 16 by current sink circuit 17. The base of transistor 11 is connected to the collector of transistor 12, the collector of PNP transistor 18 and the base of PNP transistor 19. The base of transistor 12 is connected to the collector of transistor 11, the collector of PNP transistor 19 and the base of PNP transistor 18. The emitters of transistors 18 and 19 are connected to upper word line 21. Upper word line 21 is coupled to voltage terminal 22 by row driver circuit 23. Although memory cell 10 is described in detail, any type of memory cell may be substituted therefor. The operation of memory cell 10, row driver circuit 23 and current sink circuit 17 are well known to those skilled in the art. Generally, a row of cells is selected when increased voltage is supplied to upper word line 21 by row driver circuit 23. A particular cell in that row is read by sense amplifier 20 coupled to bit lines 13 and 14. A first read current through bit line 13 or 14 flows directly to sense amplifier 20. A second read current through the other bit line 13 or 14 flows through one side of the memory cell to upper word line 21. When cell 10 is written, the first read current is directed through cell 10 and the second read current is directed directly to sense amplifier 20.

NPN transistors 24 and 25 have their bases connected to column decode circuit 26 and their collectors connected to bit lines 13 and 14, respectively. The emitters of transistors 24 and 25 are connected to the collectors of current source transistors 27 and 28, respectively. The bases of transistors 27 and 28 are connected to voltage terminal 29 and their emitters are coupled to voltage terminal 16 by resistors 31 and 32, respectively. Current from transistors 27 and 28 is steered by the appropriate pair of transistors 24 and 25 to the selected column by column decode circuit 26.

Logic circuit 33 has outputs 34 and 35 coupled to the bases of transistors 36 and 37, respectively, and provides complementary logic signals for biasing alternatively either transistor 36 or 37. The collectors of transistors 36 and 37 are connected to voltage terminal 22. The emitter of transistor 36 is coupled to node 38 by resistor 39 and the emitter of transistor 37 is coupled to node 41 by resistor 42. Voltage dependent current source transistors 43 and 44 have their collectors connected to nodes 38 and 41, respectively, and their emitters coupled to voltage terminal 16 by resistors 45 and 46, respectively.

Transistor 47 has its base and collector connected to voltage terminal 22. Transistor 48 has its base and collector connected to the emitter of transistor 47. Transistor 49 has its base and collector connected to the emitter of transistor 48. Transistor 51 has its collector connected to the emitter of transistor 49, and its base coupled to the emitter of transistor 49 by resistor 52 and to node 53 by resistor 54. Transistors 47, 48 and 49 function as diodes and transistor 51 and resistors 52 and 54 function as an $nV_{be}$ generator for setting the voltage level at node 53. Transistor 55 has its collector connected to node 53, its base connected to voltage terminal 56, and its emitter coupled to voltage terminal 16 by resistor 57. Node 53 is connected to and biases the bases of transistors 43 and 44.

Transistor 58 has its collector connected to voltage terminal 22 and its base connected to node 38. Transistor 59 has its base and collector connected to the emitter of transistor 58. Transistor 61 has its base and collector connected to the emitter of transistor 59, and its emitter coupled to voltage terminal 16 by resistor 62. Transistor 63 has its collector connected to voltage terminal 22 and its base connected to node 41. Transistor 64 has its base and collector connected to the emitter of transistor 63. Transistor 65 has its base and collector connected to the emitter of transistor 64, and its emitter coupled to voltage terminal 16 by resistor 66. Transistor 67 has its collector connected to the emitter of transistor 25, its base connected to the emitter of transistor 61, and its emitter coupled to voltage terminal 16 by resistor 68. Transistor 69 has its collector connected to the emitter of transistor 24, its base connected to the emitter of transistor 65, and its emitter coupled to voltage terminal 16 by resistor 71.

The voltage level at node 53 is $-4.5\ V_{be}$ (4.5 $V_{be}$ below voltage $V_{CC}$ on terminal 22) due to the drop across transistors 47, 48, 49, and 51 and resistors 52 and 54. Therefore (since the resistance of resistor 54 is twice the resistance of resistor 52), $$V_{R46} = -V_{EE} - 5.5\ V_{be}$$

where $V_{R46}$ = the voltage across resistor 46, and
$V_{EE}$ = the voltage on terminal 16.

Since the resistance of resistors 42 and 46 are made to be equal and since the current through both resistors is equal, the voltage drop across each resistor will be equal.

The voltage level on outputs 34 and 35, for example, would be a minus base-emitter voltage ($-V_{be}$) and zero volts, respectively, or zero volts and a minus base-emitter voltage ($-V_{be}$), respectively. For the case where output 35 is zero volts, $$V_{e37} = -V_{be},$$

where $V_{e37}$ = the emitter voltage of transistor 37, and $$V_{41} = V_{e37} - V_{R42},$$

where $V_{41}$ = the voltage at node 41, and
$V_{R42}$ = the voltage across resistor 42.

Therefore (since $V_{R42} = V_{R46}$), $$V_{41} = -V_{be} - (-V_{EE} - 5.5\ V_{be}), \text{ and}$$

$$V_{41} = V_{EE} + 4.5\ V_{be}.$$

Therefore, the voltage at the base of transistor 69 is $V_{EE} + 1.5\ V_{be}$.

For the case where output 35 is at $-V_{be}$ volts, $$V_{e37} = -2\ V_{be}, \text{ and}$$

$$V_{41} = V_{EE} + 3.5\ V_{be}.$$

Therefore, the voltage at the base of transistor 69 is $V_{EE} + 0.5\ V_{be}$.

In a similar fashion, the voltage at the base of resistor 67 would be $V_{EE} + 1.5\ V_{be}$ for the case where output 34 is zero volts and $V_{EE} + 0.5\ V_{be}$ for the case where output 34 is $-V_{be}$.

Thus, complementary signals on outputs 34 and 35 determine the voltage level on the bases of transistors 67 and 69. These voltages have a constant offset with respect to voltage $V_{EE}$. When transistor 67 conducts, current is sunk from bit line 14 and when transistor 69 conducts, current is sunk from bit line 13.

In summary, the write current flowing through transistors 67 and 69 is controlled by a logical input to logic circuit 33. The collectors of transistors 67 and 69 have only approximately $(KT/q)\ln X$ logic swing, where $X$ equals the summation of the write current and read current divided by the read current, T is the absolute temperature, K is a constant, and q is a constant for electrical charge. The write current flowing through transistors 67 and 69 is substantially independent of $V_{EE}$.

By now it should be appreciated that there has been provided an improved memory circuit having a selectable write current source wherein write current flows only in the write mode. A voltage regulator provides a quick response to a logic signal for providing the write current.

I claim:

1. A memory circuit having a read mode and a write mode, including a first voltage terminal and a second voltage terminal, said circuit comprising:
a first word line;
a second word line;
a first bit line;
a second bit line;
a memory cell coupled between said first and second word lines and coupled between said first and second bit lines;
first means coupled between said first voltage terminal and said first word line for selectively applying voltage to said first word line;
second means coupled between said second word line and said second voltage terminal for sinking current from said second word line;
third means coupled to said first and second bit lines for sensing current in said first and second bit lines;
fourth means coupled to said first and second bit lines for enabling current through said first and second bit lines;
fifth means coupled between said second voltage terminal and both said first and second bit lines for sinking a read current through said first and second bit lines; and
sixth means coupled to said first and second bit lines for selectively sinking a write current from one of said first and second bit lines, said write current flowing through said sixth means only during said write mode.

2. The memory circuit according to claim 1 wherein said sixth means comprises:
seventh means coupled between said bit lines and said second voltage terminal for sinking said write current;
eighth means for receiving a logic input;
ninth means coupled between said first voltage terminal and said second voltage terminal and coupled between said eighth means and said seventh means for providing an output to said seventh means, said output not subject to variations in voltage on either of said first voltage terminal or said second voltage terminal.

3. The memory circuit according to claim 2 wherein said ninth means comprises:
tenth means coupled between said first supply voltage terminal and said second supply voltage terminal and coupled to said eighth means for referencing a voltage on said first supply voltage terminal to a voltage on said second supply voltage terminal;
eleventh means coupled between said first supply voltage terminal and said second supply voltage terminal and coupled to said tenth means for setting a voltage within said tenth means; and
twelfth means coupled between said first supply voltage terminal and said second supply voltage terminal and coupled to said eleventh means for providing an output voltage to said seventh means, said output voltage referenced to a voltage on said second voltage terminal and independent of variations in voltages on said first and second supply voltage terminals.

4. The memory circuit according to claim 3 wherein said tenth means comprises:

a first transistor having a collector coupled to said first supply voltage terminal, a base coupled to said eighth means; and
a first resistor coupled between an emitter of said first transistor and both said eleventh means and said twelfth means.

5. The memory circuit according to claim 4 wherein said eleventh means comprises:
thirteenth means coupled between said first supply voltage terminal and a node for setting a voltage at said node;
fourteenth means coupled between said node and said second supply voltage terminal for sinking current from said node;
a second transistor having a base coupled to said node and a collector coupled to said first transistor by said first resistor; and
a resistor coupled between an emitter of said second transistor and said second supply voltage terminal.

6. The memory circuit according to claim 5 wherein said twelfth means comprises:
a third transistor having a collector coupled to said first supply voltage terminal and a base coupled to said collector of said second transistor; and
fifteenth means coupled between an emitter of said third transistor and said second supply voltage terminal for providing said output voltage.

7. The memory circuit according to claim 3 further comprising:
sixteenth means coupled between said first supply voltage terminal and said second supply voltage terminal and coupled to said eighth means for referencing a voltage on said first supply voltage terminal to a voltage on said second supply voltage terminal;
seventeenth means coupled between said first supply voltage terminal and said second supply voltage terminal and coupled to said sixteenth means for setting a voltage within said seventeenth means; and
eighteenth means coupled between said first supply voltage terminal and said second supply voltage terminal and coupled to said seventeenth means for providing an output voltage to said seventh means, said output voltage referenced to a voltage on said second voltage terminal and independent of variations in voltages on said first and second supply voltage terminals.

8. The memory circuit according to claim 7 wherein said sixteenth means comprises:
a third transistor having a collector coupled to said first supply voltage terminal, a base coupled to said eighth means; and
a third resistor coupled between an emitter of said third transistor and both said seventeenth means and said eighteenth means.

9. The memory circuit according to claim 8 wherein said eleventh means comprises:
nineteenth means coupled between said first supply voltage terminal and a node for setting a voltage at said node;
twentieth means coupled between said node and said second supply voltage terminal for sinking current from said node;
a fourth transistor having a base coupled to said node and a collector coupled to said third transistor by said third resistor; and a fourth resistor coupled between an emitter of said fourth transistor and said second supply voltage terminal.

10. The memory circuit according to claim 9 wherein said eighteenth means comprises:
   a fifth transistor having a collector coupled to said first supply voltage terminal and a base coupled to said collector of said fourth transistor; and
   twenty first means coupled between an emitter of said fifth transistor and said second supply voltage terminal for providing said output voltage.

11. A selectable write current source for a memory circuit, said memory circuit including a first voltage terminal, a second voltage terminal, a plurality of word lines, a plurality of bit lines, a plurality of memory cells, wherein said plurality of memory cells are arranged in a matrix of rows and columns, each of said cells in a row coupled between a pair of said word lines, each of said cells in a column coupled between a pair of said bit lines, a plurality of first means, each of said first means coupled between said first voltage terminal and one of said word line of each of said rows for selectively applying voltage to said one of said word lines, a plurality of second means, each of said second means coupled between the other of said word lines of each of said rows and said second voltage terminal for sinking current from the other of said word lines, a plurality of third means, each of said third means coupled to said bit lines of each of said columns for sensing current in said bit lines, a plurality of fourth means, each of said fourth means coupled to said bit lines for enabling current through said bit lines, a plurality of fifth means, each of said fifth means coupled between said second voltage terminal and each of said fourth means for sinking a read current through said bit lines of each column, said selectable write current source comprising:
   sixth means coupled to said fourth means for selectively sinking a write current from at least one of said bit lines of each of said columns, said write current flowing only when data is being written into one of said memory cells.

12. The selectable write current source according to claim 11 wherein said sixth means comprises:
   seventh means coupled between said bit lines and said second voltage terminal for sinking said write current;
   eighth means for receiving a logic input;
   ninth means coupled between said first voltage terminal and said second voltage terminal and coupled between said eighth means and said seventh means for providing an output to said seventh means, said output not subject to variations in voltage on either of said first voltage terminal or said second voltage terminal.

13. The selectable write current source according to claim 12 wherein said ninth means comprises:
   tenth means coupled between said first supply voltage terminal and said second supply voltage terminal and coupled to said eighth means for referencing a voltage on said first supply voltage terminal to a voltage on said second supply voltage terminal;
   eleventh means coupled between said first supply voltage terminal and said second supply voltage terminal and coupled to said tenth means for setting a voltage within said tenth means; and
   twelfth means coupled between said first supply voltage terminal and said second supply voltage terminal and coupled to said eleventh means for providing an output voltage to said seventh means, said output voltage referenced to a voltage on said second voltage terminal and independent of variations in voltages on said first and second supply voltage terminals.

14. The selectable write current source according to claim 13 wherein said tenth means comprises:
   a first transistor having a collector coupled to said first supply voltage terminal, a base coupled to said eighth means; and
   a first resistor coupled between an emitter of said first transistor and both said eleventh means and said twelfth means.

15. The selectable write current source according to claim 14 wherein said eleventh means comprises:
   thirteenth means coupled between said first supply voltage terminal and a node for setting a voltage at said node;
   fourteenth means coupled between said node and said second supply voltage terminal for sinking current from said node;
   a second transistor having a base coupled to said node and a collector coupled to said first transistor by said first resistor; and
   a resistor coupled between an emitter of said second transistor and said second supply voltage terminal.

16. The selectable write current source according to claim 15 wherein said twelfth means comprises:
   a third transistor having a collector coupled to said first supply voltage terminal and a base coupled to said collector of said second transistor; and
   fifteenth means coupled between an emitter of said third transistor and said second supply voltage terminal for providing said output voltage.

17. The selectable write current source according to claim 13 further comprising:
   sixteenth means coupled between said first supply voltage terminal and said second supply voltage terminal and coupled to said eighth means for referencing a voltage on said first supply voltage terminal to a voltage on said second supply voltage terminal;
   seventeenth means coupled between said first supply voltage terminal and said second supply voltage terminal and coupled to said sixteenth means for setting a voltage within said seventeenth means; and
   eighteenth means coupled between said first supply voltage terminal and said second supply voltage terminal and coupled to said seventeenth means for providing an output voltage to said seventh means, said output voltage referenced to a voltage on said second voltage terminal and independent of variations in voltages on said first and second supply voltage terminals.

18. The selectable write current source according to claim 17 wherein said sixteenth means comprises:
   a third transistor having a collector coupled to said first supply voltage terminal, a base coupled to said eighth means; and
   a third resistor coupled between an emitter of said third transistor and both said seventeenth means and said eighteenth means.

19. The selectable write current source according to claim 18 wherein said eleventh means comprises:

nineteenth means coupled between said first supply voltage terminal and a node for setting a voltage at said node;

twentieth means coupled between said node and said second supply voltage terminal for sinking current from said node;

a fourth transistor having a base coupled to said node and a collector coupled to said third transistor by said third resistor; and a fourth resistor coupled between an emitter of said fourth transistor and said second supply voltage terminal.

20. The selectable write current source according to claim 19 wherein said eighteenth means comprises:

a fifth transistor having a collector coupled to said first supply voltage terminal and a base coupled to said collector of said fourth transistor; and twenty first means coupled between an emitter of said fifth transistor and said second supply voltage terminal for providing said output voltage.

* * * * *